March 27, 1973 J. G. KEIL 3,723,201
DIFFUSION PROCESS FOR HETEROPITAXIAL GERMANIUN DEVICE FABRICATION UTILIZING POLYCRYSTALLINE SILICON MASK
Filed Nov. 1, 1971
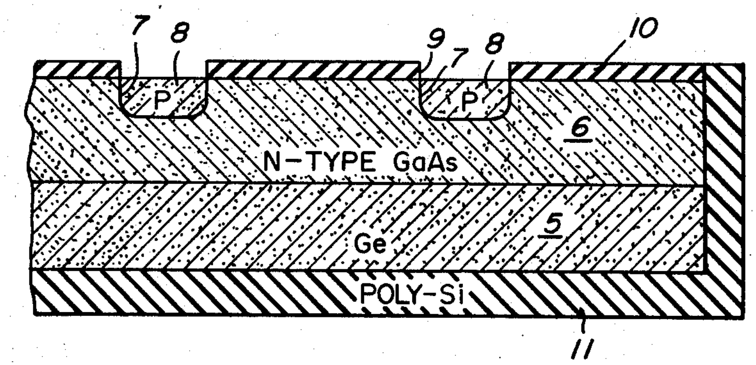

United States Patent Office 3,723,201

Patented Mar. 27, 1973

3,723,201

DIFFUSION PROCESS FOR HETEROEPITAXIAL GERMANIUM DEVICE FABRICATION UTILIZING POLYCRYSTALLINE SILICON MASK

John G. Keil, Scottsdale, Ariz., assignor to Motorola, Inc., Franklin Park, Ill.

Filed Nov. 1, 1971, Ser. No. 194,467

Int. Cl. H01l 7/44, 7/00; B01j 17/00

U.S. Cl. 148—175 5 Claims

ABSTRACT OF THE DISCLOSURE

There is disclosed a method of manufacturing light emitting semiconductor structures of GaAs and $GaAs_xP_{1-x}$ on germanium substrates utilizing a diffusion mask of polycrystalline silicon.

BACKGROUND OF THE INVENTION

This invention relates to a manufacture of light emitting semiconductor devices and more particularly to a fabrication method for GaAs and $GaAs_xP_{1-x}$ light emitting diodes.

Various fabrication techniques have been utilized in the manufacture of light emitting diodes from GaAs and GaAsP. Because of the relatively high cost of producing monocrystalline GaAs substrate material which can be sawed into wafers, it is preferable to fabricate these devices by a heteroepitaxial technique utilizing a more economical monocrystalline substrate, preferably germanium. In a technique of this type, GaAs of one conductivity type is epitaxially deposited upon the germanium substrate and then impurities of the opposite conductivity type are diffused therein to fabricate the PN junctions from which light emission takes place. If the light emitting junction is to be formed in GaAsP, it is customary to initiate an epitaxial layer of GaAs on the germanium substrate and then grade the epitaxial layer to the desired composition of GaAsP of a particular conductivity type prior to the diffusion. The GaAs or the GaAsP is normally doped to produce an N-conductivity type during epitaxial deposition and then a suitable dopant used to produce by diffusion the P-region defining the light emitting or electroluminescent junction. One of the most important dopants for producing the diffused P-conductivity region is zinc. However, it is found that zinc alloys with the germanium substrate during the diffusion process and produced is localized "melting" of the germanium substrate during the diffusion cycles, leading to inefficient and non-reproducible fabrications of the light emitting diodes.

SUMMARY OF THE INVENTION

It is the primary object of the present invention to provide a method of manufacturing light emitting semiconductor devices.

A further object of the invention is to provide an improved heteroepitaxial method of manufacturing light emitting semiconductor devices.

A still further object of the invention is to provide a method of manufacturing light emitting diode devices on germanium substrates.

Another object of the invention is to provide a heteroepitaxial method of manufacturing light emitting diodes on germanium substrates.

In accordance with the aforementioned objects, there is provided a heteroepitaxial method of manufacturing light emitting semiconductor devices which includes a step of masking a germanium substrate with polycrystalline silicon prior to diffusion of the zinc dopant into the semiconductor.

THE DRAWING

Further objects and advantages of the invention will be understood to one skilled in the art from the following complete description of the preferred embodiment thereof and from the drawing wherein:

The figure is a cross sectional view of a portion of a wafer subsequent to the diffusion step.

DETAILED DESCRIPTION

Zinc is one of the most common dopants for diffusing P-type conductivity regions into III–V compounds such as GaAs, GaAsP and GaP. When manufacturing light emitting diode structures in III–V compounds such as GaAs, GaAsP, it is customary to grow the monocrystalline III–V epitaxial layer on a monocrystalline substrate having a lattice constant closely matching the lattice constant of the III–V compound, such as germanium or alloys thereof. It is found that during the diffusion of the zinc into the III–V compound, the zinc alloys with the germanium substrate and this warps the substrate by causing localized melting thereof. Conventional diffusion masks such as silicon dioxide and silicon nitride have been found to not mask the germanium adequately against diffusion of the zinc thereinto, but it has been discovered that in accordance with the invention, polycrystalline silicon deposited as a diffusion mask will protect the germanium substrate against diffusion of the zinc.

A cross sectional view of a portion of a wafer subsequent to a diffusion of P-conductivity regions utilizing zinc dopant is depicted in the drawing in accordance with the preferred embodiment of the invention. The starting wafer 5 of germanium has an epitaxial layer 6 of N-type GaAs grown thereon and PN junctions 7 defined in the N-conductivity GaAs by P-conductivity regions 8 diffused through windows 9 in masking layer 10. Surrounding the germanium to mask it against diffusion from the source of zinc dopant is a layer 11 of polycrystalline silicon. It will be understood that a large plurality of P-conductivity diffusion regions may be made in a single wafer and the completed wafer then sliced into chips to form discrete light emitting diodes. Alternately, the wafer may comprise a plurality of diffused regions which will be sliced into bars including a matrix of diodes to form a light emitting diode array.

The foregoing structure is obtained by preparing a monocrystalline wafer of germanium for epitaxial deposition by a suitable lapping and polishing technique. The germanium wafer 5 is then placed in a deposition chamber and gallium arsenide having an N-conductivity is grown thereon by either vapor or liquid epitaxial techniques, vapor epitaxial technique being preferred. After a suitable thickness of gallium arsenide has been formed on the surface of the wafer 5, the composite structure is removed from the epitaxial chamber and may be polished to provide a smooth surface on the epitaxial growth region. The germanium wafer 5 is then covered by a sputtering or chemical vapor deposition technique with polycrystalline silicon 11 and a masking layer 10 placed over the gallium arsenide. If desired, the polycrystalline silicon layer 11 may be utilized to completely cover both the germanium and the gallium arsenide to serve as the diffusion mask. In any case, suitable windows 9 are opened in the masking layer 10 and the structure placed in an evacuated, sealed ampoule containing a source of zinc dopant such as a $Zn_3As_2$ or $ZnAs_2$. The diffusion preferably takes place at approximately 700–900° C. for a period of up to 6 hours. It is found that the polycrystalline silicon prevents diffusion of the zinc into the germanium and no warping or cracking of the wafer caused by melting of the germanium zinc alloy takes place.

The polycrystalline silicon layer 11 should be approximately 10,000 A. in thickness for diffusions at 850° C. If the diffusions are to be made at a temperature of, for example, 900° C., a thickness of approximately 15,000 A. of polycrystalline silicon is preferred. While GaAs has been referred to specifically, GaAsP or GaP may be substituted therefore either directly or by graded epitaxy.

It is to be noted that the poly-silicon layer 11 can be deposited on the back of the germanium substrate 5 prior to the epitaxial deposition 6. The important point being that the masking layer 11 be present in an integral form at the time of the zinc diffusion.

It is thus seen that there is provided a method of masking germanium substrates against melting caused by alloying of zinc dopants therein resulting in an economic preparation of III–V semiconductor structures having P-regions therein, wherein the dopant is zinc. The diffusion mask of polycrystalline silicon prevents cracking and warping of the germanium substrates during the diffusion process.

While the invention has been disclosed by way of a preferred embodiment thereof, suitable modifications may be made therein without departing from the spirit and scope of the invention.

What is claimed is:

1. In a method of fabricating semiconductor devices on a germanium substrate comprising the steps of:

epitaxially depositing on a surface of the germanium substrate a layer of semiconductor material selected from the group consisting of gallium arsenide, gallium arsenide phosphide and gallium phosphide; covering at least the other surfaces of said germanium substrate with a masking layer of polycrystalline silicon; and diffusing a zinc dopant into a portion of the semiconductor layer.

2. The method as recited in claim 1 wherein said masking layer of polycrystalline silicon is approximately 10,000 A. thick.

3. A method as recited in claim 2 wherein the step of diffusing a zinc dopant takes place at a temperature of 700–900° C. for a period of up to 6 hours.

4. A method as recited in claim 1 wherein said polycrystalline silicon is deposited on the germanium substrate by sputtering or by chemical vapor deposition.

5. A method as recited in claim 4 wherein the polycrystalline silicon is deposited on the germanium substrate and the semiconductor material; and further including the step of opening windows to said semiconductor material prior to the diffusion step.

References Cited

UNITED STATES PATENTS

| | | | |
|---|---|---|---|
| 2,841,510 | 7/1958 | Mayer | 148—187 X |
| 3,249,473 | 5/1966 | Holonyak | 148—175 |
| 3,299,330 | 1/1967 | Watanabe et al. | 317—235 |
| 3,372,067 | 3/1968 | Schafer | 148—187 |
| 3,406,049 | 10/1968 | Marinace | 148—175 |
| 3,636,617 | 1/1972 | Schmidt et al. | 29—578 |
| 3,629,018 | 12/1971 | Henderson et al. | 148—187 |

FOREIGN PATENTS

| | | | |
|---|---|---|---|
| 1,099,098 | 1/1968 | Great Britain | 148—175 |

CHARLES N. LOVELL, Primary Examiner
W. G. SABA, Assistant Examiner

U.S. Cl. X.R.

29—576, 578; 117—212, 215; 148—174, 175, 187; 317—235 R